(12) United States Patent
Sanga

(10) Patent No.: US 8,674,387 B2
(45) Date of Patent: Mar. 18, 2014

(54) LIGHT EMITTING DEVICE

(75) Inventor: Daisuke Sanga, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/264,725

(22) PCT Filed: Apr. 16, 2010

(86) PCT No.: PCT/JP2010/002768
§ 371 (c)(1),
(2), (4) Date: Oct. 14, 2011

(87) PCT Pub. No.: WO2010/119701
PCT Pub. Date: Oct. 21, 2010

(65) Prior Publication Data
US 2012/0037942 A1      Feb. 16, 2012

(30) Foreign Application Priority Data

Apr. 16, 2009  (JP) .................................. 2009-099745
Dec. 4, 2009  (JP) .................................. 2009-276730

(51) Int. Cl.
*H01L 33/00*  (2010.01)

(52) U.S. Cl.
USPC ........ 257/98; 257/99; 257/100; 257/E33.057; 257/E33.059; 257/E33.066; 257/E33.068; 257/E33.072

(58) Field of Classification Search
None
See application file for complete search history.

(56) References Cited

U.S. PATENT DOCUMENTS

| | | | | |
|---|---|---|---|---|
| 5,055,892 A * | 10/1991 | Gardner et al. | .................. | 257/99 |
| 5,742,120 A * | 4/1998 | Lin | ............................... | 313/512 |
| 5,813,753 A * | 9/1998 | Vriens et al. | .................. | 362/293 |
| 6,614,172 B2 * | 9/2003 | Chiu et al. | ..................... | 313/501 |
| 6,630,689 B2 * | 10/2003 | Bhat et al. | ........................ | 257/79 |
| 6,876,008 B2 * | 4/2005 | Bhat et al. | ........................ | 257/99 |
| 6,891,197 B2 * | 5/2005 | Bhat et al. | ........................ | 257/79 |
| 6,995,402 B2 * | 2/2006 | Ludowise et al. | ............... | 257/91 |
| 7,148,514 B2 * | 12/2006 | Seo et al. | ........................ | 257/79 |
| 7,211,832 B2 * | 5/2007 | Hirose | ............................ | 257/98 |
| 7,411,225 B2 * | 8/2008 | Kim et al. | ..................... | 257/100 |
| 7,449,724 B2 * | 11/2008 | Yamazaki et al. | .............. | 257/98 |
| 7,491,980 B2 * | 2/2009 | Higaki et al. | .................. | 257/99 |

(Continued)

FOREIGN PATENT DOCUMENTS

| JP | 2006-351808 | 12/2006 |
|---|---|---|
| JP | 2007-042320 | 2/2007 |

(Continued)

OTHER PUBLICATIONS

International Search Report for PCT/JP2010/002768, mailed May 18, 2010, 2 pages.

*Primary Examiner* — Hoang-Quan Ho
(74) *Attorney, Agent, or Firm* — Foley & Lardner LLP

(57) ABSTRACT

A light emitting device is provided with a base member, an interconnect pattern disposed on an upper surface of the base member, a light reflecting layer comprising a first layer disposed on a part of the interconnect pattern and formed from a metal material, and a second layer made of a dielectric multilayer reflecting film made with stacked layers of dielectric films having different refractive indices and covering an upper surface and side surfaces of the first layer, a light emitting element chip fixed so as to face at least a part of the light reflecting layer, and a light transmissive sealing member sealing the light reflecting layer and the light emitting element chip.

21 Claims, 4 Drawing Sheets

(56) References Cited

U.S. PATENT DOCUMENTS

| | | | |
|---|---|---|---|
| 7,622,746 B1* | 11/2009 | Lester et al. | 257/98 |
| 7,709,855 B2* | 5/2010 | Ooya et al. | 257/99 |
| 7,714,341 B2* | 5/2010 | Chil Keun et al. | 257/98 |
| 7,719,013 B2* | 5/2010 | Lee | 257/88 |
| 7,719,099 B2* | 5/2010 | Tseng et al. | 257/690 |
| 7,868,349 B2* | 1/2011 | Kim et al. | 257/100 |
| 7,884,380 B2* | 2/2011 | Hsieh | 257/94 |
| 7,947,991 B2* | 5/2011 | Wang et al. | 257/79 |
| 7,989,237 B2* | 8/2011 | Tseng et al. | 438/27 |
| 7,994,628 B2* | 8/2011 | Tseng et al. | 257/690 |
| 8,017,962 B2* | 9/2011 | Chen et al. | 257/98 |
| 8,048,694 B2* | 11/2011 | Wen et al. | 438/26 |
| 8,053,797 B2* | 11/2011 | Cheng et al. | 257/98 |
| 8,124,998 B2* | 2/2012 | Kim | 257/99 |
| 2003/0205712 A1* | 11/2003 | Bhat et al. | 257/79 |
| 2004/0252509 A1* | 12/2004 | Lin | 362/293 |
| 2005/0023548 A1* | 2/2005 | Bhat et al. | 257/99 |
| 2005/0072980 A1* | 4/2005 | Ludowise et al. | 257/79 |
| 2005/0168992 A1* | 8/2005 | Hirose | 362/296 |
| 2005/0189555 A1* | 9/2005 | Lin et al. | 257/98 |
| 2006/0261364 A1* | 11/2006 | Suehiro et al. | 257/100 |
| 2007/0090510 A1* | 4/2007 | Tseng et al. | 257/690 |
| 2007/0145401 A1 | 6/2007 | Ikehara | |
| 2007/0278509 A1* | 12/2007 | Kusunoki et al. | 257/98 |
| 2008/0006837 A1* | 1/2008 | Park et al. | 257/98 |
| 2008/0191620 A1* | 8/2008 | Moriyama et al. | 313/506 |
| 2008/0210963 A1* | 9/2008 | Lin et al. | 257/98 |
| 2009/0078956 A1* | 3/2009 | Tseng et al. | 257/98 |
| 2009/0146155 A1* | 6/2009 | Wang et al. | 257/82 |
| 2009/0267095 A1* | 10/2009 | Cheng et al. | 257/98 |
| 2010/0163897 A1* | 7/2010 | Hsiao et al. | 257/98 |
| 2010/0207152 A1* | 8/2010 | Won | 257/98 |
| 2010/0308300 A1* | 12/2010 | Pan | 257/13 |
| 2011/0089446 A1* | 4/2011 | Ku et al. | 257/98 |
| 2011/0096508 A1* | 4/2011 | Bita et al. | 361/728 |
| 2012/0032211 A1* | 2/2012 | Schindler et al. | 257/98 |

FOREIGN PATENT DOCUMENTS

| | | | |
|---|---|---|---|
| JP | 2008-277349 | * | 4/2007 |
| JP | 2007-201420 | | 8/2007 |
| JP | 2008-277349 | | 11/2008 |
| JP | 2008-300621 | | 12/2008 |
| WO | WO-2007/114306 A1 | | 10/2007 |

* cited by examiner

LIGHT EMITTING DEVICE

BACKGROUND OF THE INVENTION

1. Field of the Invention

Present invention relates to a light emitting device usable for indicators, lighting apparatuses, displays, backlight of liquid crystal displays, and the like, and more particularly to light emitting devices in which a semiconductor light emitting chip is mounted on a mounting substrate having an interconnect on its surface.

2. Description of Related Art

Conventionally, there has been proposed a light emitting device in which a light transmissive sealing member capable of serving as a lens integrally formed on a mounting substrate having a semiconductor light emitting chip such as an LED or LD mounted thereon so as to improve light extracting efficiency from the semiconductor light emitting chip. In such light emitting devices, further improvement in the light extraction efficiency has been studied.

For example, Patent Reference 1 discloses a light emitting device having a mounting substrate provided with a base member made of an insulating resin or a ceramic on which a Cu wiring pattern is arranged, an LED chip mounted on the Cu wiring pattern, and a light transmissive resin covering the Cu wiring pattern and the LED chip, and in the light emitting device, Ag plating is applied between the Cu wiring pattern and the LED chip, and further, a white-color or silver-color resin is coated on the exposed upper surface of the base member. In this way, light extraction efficiency is improved.

RELATED ART REFERENCE

Patent Reference

Patent Reference 1: JP 2007-201420A

DISCLOSURE OF THE INVENTION

Problem to be Solved by the Invention

However, although the light emitting device disclosed in Patent Document 1 exhibits, with a use of a silver plating or a coating of white or silver color, a high reflectivity for various incident angles of light irradiated on the mounting substrate from the LED chip, it is unable to completely reflect the light from the LED chip. In order to obtain sufficient reflectivity, a reflecting film made by a silver plating or a white or silver-color coating such as described above needs to have a relatively large thickness, which leads to difficulty in fabrication of highly precise products, also it is often accompanied by undesirable light scattering, and may result in a decrease in the light extraction efficiency.

In the light emitting device described above, if the light transmissive member covering the LED chip is made of a material which allows sulfur gas to permeate, the silver plating deteriorates in the course of time of operation under high temperature and high humidity, which results in significant deterioration of the reflective function.

Accordingly, an objective of the present invention is to provide a light emitting device having high reliability and capable of emitting light with high optical output.

Means to Solve the Problem

In order to achieve the objective described above, a light emitting device of the present invention includes a mounting substrate having an interconnect pattern disposed on an upper surface of a base member, a light reflecting layer including a first layer disposed on a part of an upper surface of the interconnect pattern and made of a metal material, and a second layer made of a dielectric multilayer reflecting film made with stacked layers of dielectric films of different refractive indices and covering an upper surface and side surfaces of the first layer, a light-emitting element chip fixed to cover at least a part of the light reflection layer, and a light transmissive sealing member sealing the light reflection layer and the light-emitting element chip.

Further, the second layer preferably covers the upper surface of the base member exposed through the interconnect pattern.

Further, the first layer is disposed between the upper surface of the base member substrate exposed through the interconnect pattern and the second layer, and spaced apart from the interconnect pattern.

Further, the light reflecting layer includes a third layer covering an upper surface and side surfaces of the second layer, the third layer is made of a material having a refractive index smaller than the refractive index of the light transmissive member, and has a thickness capable of totally reflecting light emitted from the light emitting element chip.

Also, the third layer is preferably made of a thin dielectric film having a low refractive index with a thickness of 300 nm or more.

Effect of the Invention

According to the present invention, absorption of light from the light emitting element chip at the upper surface of mounting substrate, to which light from the light emitting element chip is irradiated with a high density, can be suppressed to a minimum, so that a light emitting device of excellent light extracting efficiency can be realized.

DETAILED DESCRIPTION OF THE EMBODIMENTS

Figure 1A:
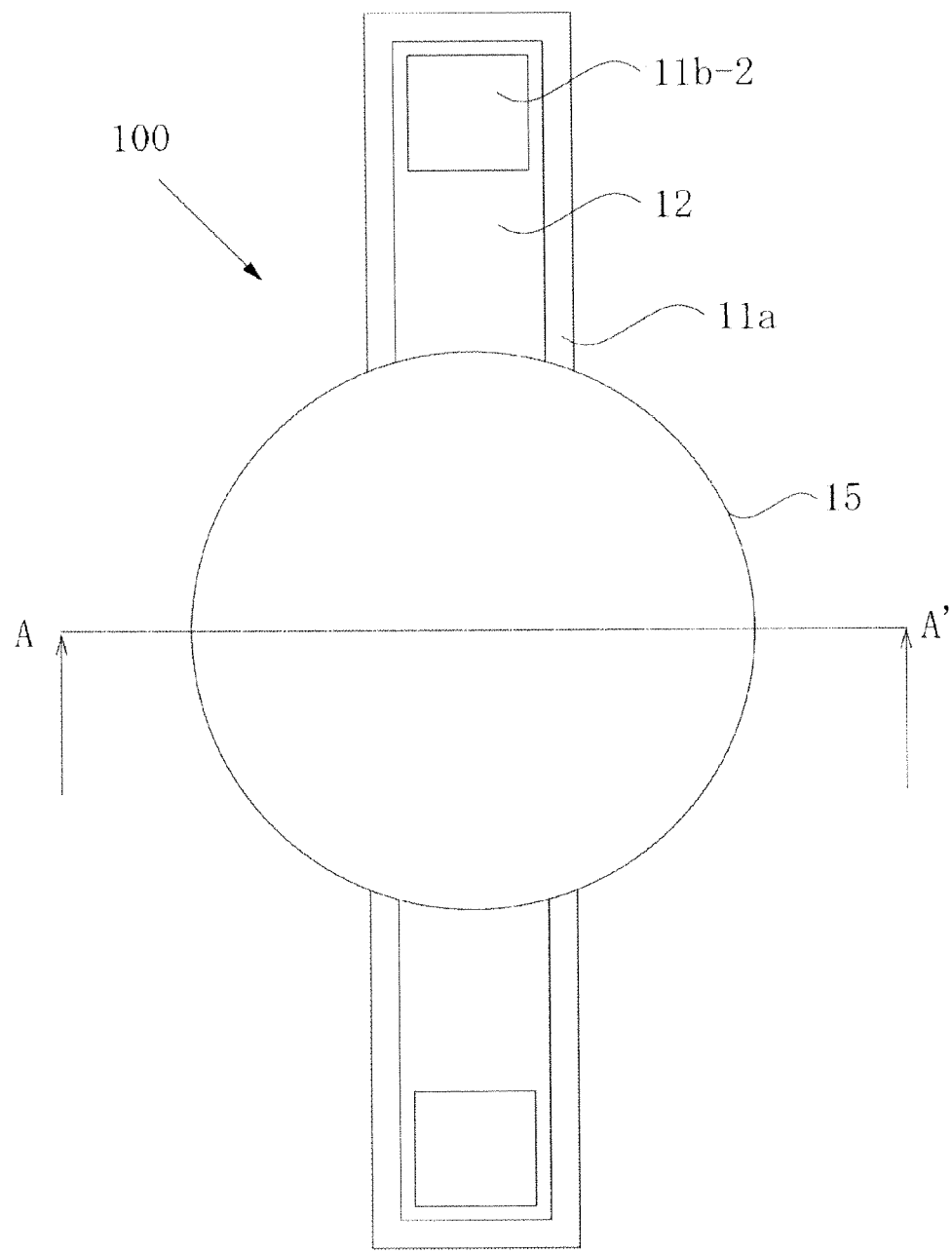
FIG. 1A is a schematic plan view showing an embodiment of a light emitting device according to the present invention.

Preferred embodiments to carry out the present invention will be described below with reference to the accompanying drawings. The preferred embodiments are intended as illustrative of a light emitting device to give a concrete form to technical ideas of the present invention, and the scope of the invention is not limited to those described below.

Further, the members shown in claims attached hereto are not specifically limited to members in the embodiments. Particularly, the sizes, materials, shapes and the arrangement relationships of the members described the preferred embodiments are given as an example and not as a limitation to the scope of the invention. The sizes and the arrangement relationships of the members in each of drawings are occasionally shown exaggerated for ease of explanation. In the description below, the same designations or the same reference numerals denote the same or like members and duplicate descriptions will be appropriately omitted.

Preferred embodiments of the present invention will be described below with reference to the drawings.

Construction

A construction of a light emitting device according to the present embodiment of the present invention will be described with reference to FIG. 1A through FIG. 4. FIG. 1B is a schematic cross sectional view of the light emitting device 100 of FIG. 1A taken along line A-A'. Further, FIG. 1C is a schematic enlarged view of the region encircled by a dotted line in FIG. 1B.

Figure 1B:
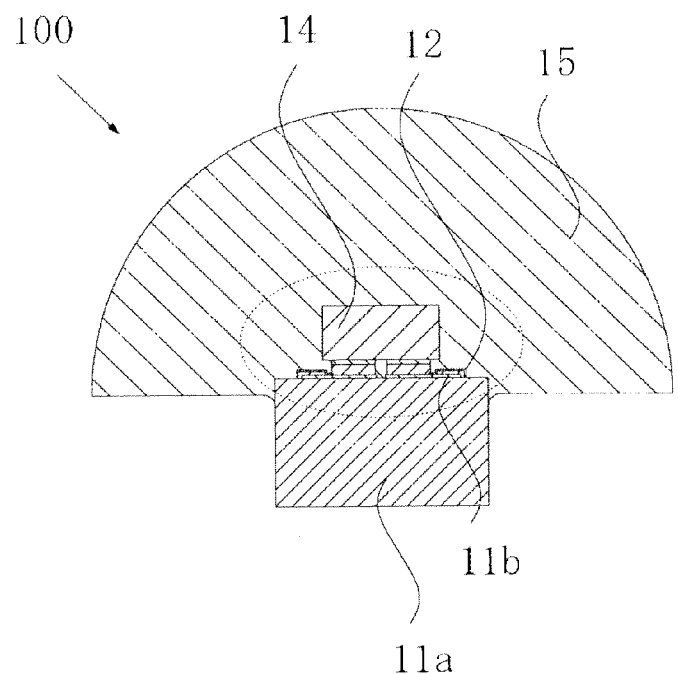
FIG. 1B is a schematic cross sectional view of the light emitting device of FIG. 1A taken along the line A-A'.
Figure 1C:
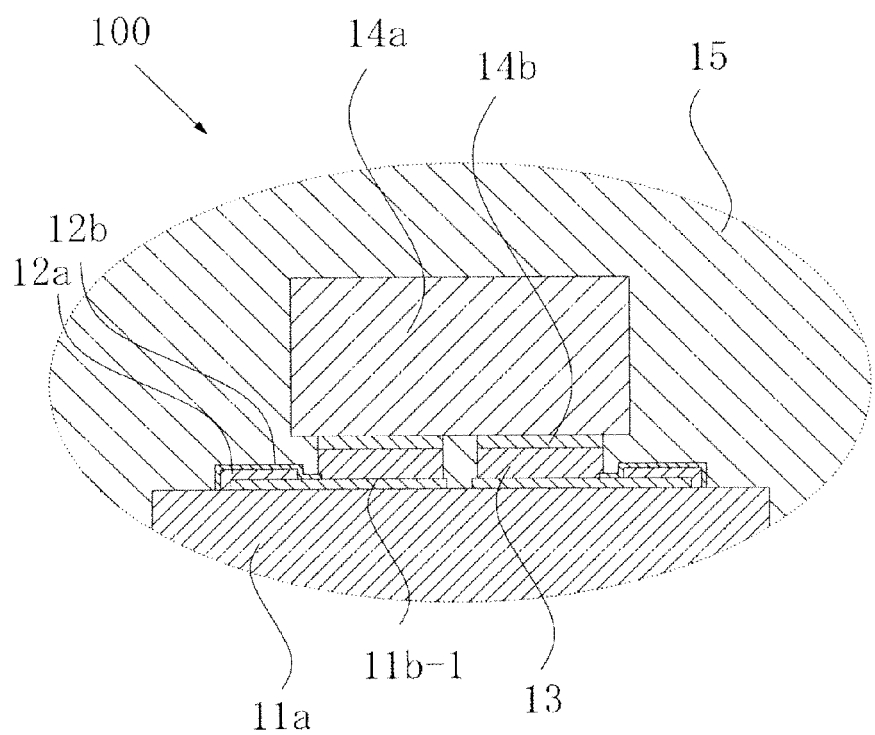
FIG. 1C is a schematic enlarged view of the region encircled by a dotted line in FIG. 1B.

As shown in FIG. 1A to FIG. 1C, the light emitting device 100 according to the present embodiment is provided with a mounting substrate 11 having an interconnect pattern 11b disposed on an upper surface of the base member 11a, a light reflecting layer 12 disposed on the upper surface of the interconnection pattern 11b, except for the mounting portion 11b-1 where the electrodes 14b of the light emitting element chip 14 are fixed and the external connection electrode terminal 11b-2, a light emitting element chip 14 mounted on the mounting portion 11b-1 in a flip-chip manner, and a light transmissive sealing member 15 sealing the light reflecting layer 12 and the light emitting element chip 14. Particularly, the light reflecting layer 12 includes a first layer 12a made of a metal material and a second layer 12b made of a dielectric multilayer reflecting film made with stacked layers of dielectric films of different refractive indices and covering the upper surface and side surfaces of the first layer. A part of the surface of the light emitting element chip 14 at a side where the electrodes 14b are disposed, and a part of the upper surface of the light reflecting layer 12 are facing each other.

Mounting Substrate

The mounting substrate 11 includes a interconnect pattern 11b on a base member 11a having a rectangular planar shape. The interconnect pattern 11b of the present embodiment is provided with a mounting portion 11b-1 for fixing the electrodes of the light emitting element chip 14 and an external connection electrode terminal 11b-2 for electrically connecting to outside, on the upper surface side of the base member 11a, but it is not limited thereto, for the sake of downsizing, a penetrating via or the like may be provided in the base member 11a to dispose the external connection electrode terminal on the undersurface side of the base member 11a.

Base Member

The material of the base member 11a is not specifically limited as long as it is capable of securing the light emitting element chip above it and of holding the interconnect pattern 11b and the light reflecting layer 12 on its upper surface. Especially, a ceramic, an opaque white resin, or the like, a material having insulation properties and light blocking properties is preferably employed. On the other hand, the base member 11a locates near the light emitting element chip 14 which is a possible heat source. Therefore, the base member 11a is preferably formed with a material having excellent heat conductivity and a structure capable of releasing heat to outside. Examples of materials for this case include metals such as aluminum nitride, copper, copper alloy, and aluminum. When a conductive material is used as the base member 11a, an insulating layer is needed between the upper surface of the base member 11a and the lower surface of the interconnect pattern 11b.

Interconnect Pattern

The interconnect pattern 11b according to the present embodiment has a mounting portion 11b-1 for fixing the electrodes 14b of the light emitting element chip 14 and an external connection electrode terminal 11b-2 for electrically connecting to outside. The interconnect pattern 11b is for electrically connecting an external driving circuit and the light emitting element chip 14, and is not specifically limited except the electrical conductivity thereof, and is preferable to have good adhesion with the member 13 which is used for electrical connection with the light emitting element chip 14 and also has good electric conductivity.

The interconnect pattern 11b is constituted with a single layer, a stacked layer, or an alloy, made of a metal such as Ni, Au, Pt, Rh, Ag, Cr, Ti, Cu, W, and Mo. The surface of the interconnect pattern may be covered with Ti, Ni, Cr, or the like, to improve adhesion with the light reflecting layer 12 which is to be described later. At this time, in order to facilitate to dispose the light reflecting layer 12 with a microscopic pattern, the thickness of the interconnect is preferably not more than 10 μm, more preferably 5 μm or less, further preferably 2 μm or less.

The layer constitution, the pattern width, or the like, of the interconnect pattern 11b are preferably arranged so as not to offer a high resistance to the electric current supplied to the light emitting element chip 14. Specifically, electric resistance of 300 μΩ-cm or less is preferable and 3 μΩ-cm or less is more preferable.

In a specific examples of the method of disposing the interconnect pattern 11b, a layer of an interconnect material is deposited on the base member 11a by way of vapor deposition, plating, or the like, with a use of a metal masking, photolithography, etching, or lift-off to form a pattern.

Light Reflecting Layer

The light reflecting film 12 in the present invention includes a first layer 12a made of a metal material and a second layer 12b made of a dielectric multilayer reflecting film made with stacked layers of dielectric films of different refractive indices and covering an upper surface and side surfaces of the first layer 12a, and is partially disposed on the interconnect pattern 11b. Specifically, when the interconnect pattern 11b disposed on the upper surface of the base member 11a includes at least one of a mounting portion 11b-1 for fixing the electrodes 14b or a light-blocking portion of the light emitting element chip 14, a wire connecting portion for wire bonding with the electrodes of the light emitting element chip, and an external connection electrode terminal 11b-2 for connecting to outside, the light reflecting layer 12 is disposed on the upper surface of the interconnect pattern 11b except for those. The light reflecting layer 12 is disposed at a lower location with respect to the light emitting element chip 14, and at least a part of the upper surface of the light reflecting layer 12 faces with the lower surface of the light emitting element chip 14. The thickness of the light reflecting layer 12 is not specifically limited as long as the first layer 12a and the second layer 12b can respectively exerts sufficient reflective function, and do not reduce the productivity.

In the light emitting device 100 according to the present embodiment, the light emitting element chip 14 having the positive and negative electrodes 14b on the same side is mounted on the interconnect pattern 11b in a flip-chip configuration. Therefore, the light reflecting layer 12 is disposed on the upper surface of the interconnect pattern 11b except for the mounting portion 11b-1 where the electrodes 14b of the light emitting element chip 14 are fixed through the bonding member 13, and the external connection electrode terminal 11b-2. The end portions of the light reflecting layer 12 at the light emitting element chip 14 side are in contact with the bonding member 13 and the upper surface of the light reflecting layer 12 intersects the planes which are co-planar to respective side surfaces of the light emitting element chip 14.

As described above, with fixing the light emitting element chip 14 so as to cover at least a part of the light reflecting layer 12, the light of high density irradiated from the side surfaces of the light emitting element chip 14 and the surface around the electrodes 14b of the light emitting element chip 14 can be efficiently reflected at the light reflecting layer 12, and effectively extracted to outside.

Also, a light emitting element chip 14 as described above, provided with the positive and negative electrodes to one surface side and light transmissivity at the other surface side, of its upper and lower surfaces may be fixed such that the electrode side of the light emitting element chip 14 is facing upward and the other surface side is facing the interconnect pattern as the mounting surface. For example, it may be such that, on the upper surface of the interconnect pattern, the light reflecting layer is disposed except for the portions for wire-bonding with the electrodes of the light emitting element chip and the external connection electrode terminal, and using a light transmissive bonding member the light emitting element chip is die-bonded on the light reflecting layer. As described above, with fixing the light emitting element chip on the light reflecting layer, the light of high density irradiated from the side surfaces and the lower surface of the light emitting element chip 14 can be efficiently reflected at the light reflecting layer 12, and effectively extracted to outside.

On the other hand, in the case where a light emitting element chip is provided with, to its upper and lower surfaces, the positive and negative electrodes to one surface side and light transmissivity at the other surface side where at least a part thereof is provided with a light-blocking metal film, the light emitting element chip is preferably fixed such that the light reflecting layer is disposed on the upper surface of the interconnect wiring except for the mounting portion to be fixed with the metal film of the light emitting element chip through a bonding member and the external connection electrode terminal, and using a bonding member, the portion of the light emitting element chip provided with the metal layer is fixed with the mounting portion of the interconnect pattern exposed through the light reflecting layer. Accordingly, heat releasing property and bonding property of the light emitting element chip can be enhanced and the light of high density irradiated from the side surfaces of the light emitting element chip and the surface around the metal film of the light emitting element chip can be efficiently reflected and effectively extracted to outside. In this case, the bonding material is preferably disposed so as to be in contact with the upper surface of the optical mounting portion and the upper surface of the end portions of the light reflecting layer.

First Layer

The first layer 12a is preferably formed with a metal having high reflectivity such as Ag, Al, and Rh. In order to improve adhesion with the base member 11a and the material of the interconnect pattern 11b, a metal such as Ti or Ni may be disposed in advance at the interconnect pattern 11b side. The first layer in this case can also serves as a wiring. The thickness of the first layer is preferably 50 nm or more and 2000 nm or less, and with this, sufficient reflectivity can be obtained without reducing the productivity.

The first layer 12a is formed with a metal, which basically reflects or absorbs light but does not transmit light. On the other hand, the second layer 12b and the third layer 22c have light transmissive property and when it does not reflect light, it allows light to transmit through it. Therefore, providing the first layer 12a lower than the second layer 12b and third layer 22c enables to obtain the minimum level of reflection as entire light reflecting layer 12.

The first layer 12a is not necessarily disposed integrally with the interconnect pattern, but the first layer 12a and the interconnect pattern are preferably disposed integrally. With this, the volume of energizing path can be increased compared to the case where the interconnect pattern is the sole energizing path. With this arrangement, the electric resistance can be lowered and thus the electric resistance of the entire light emitting device can be reduced.

Figure 4:
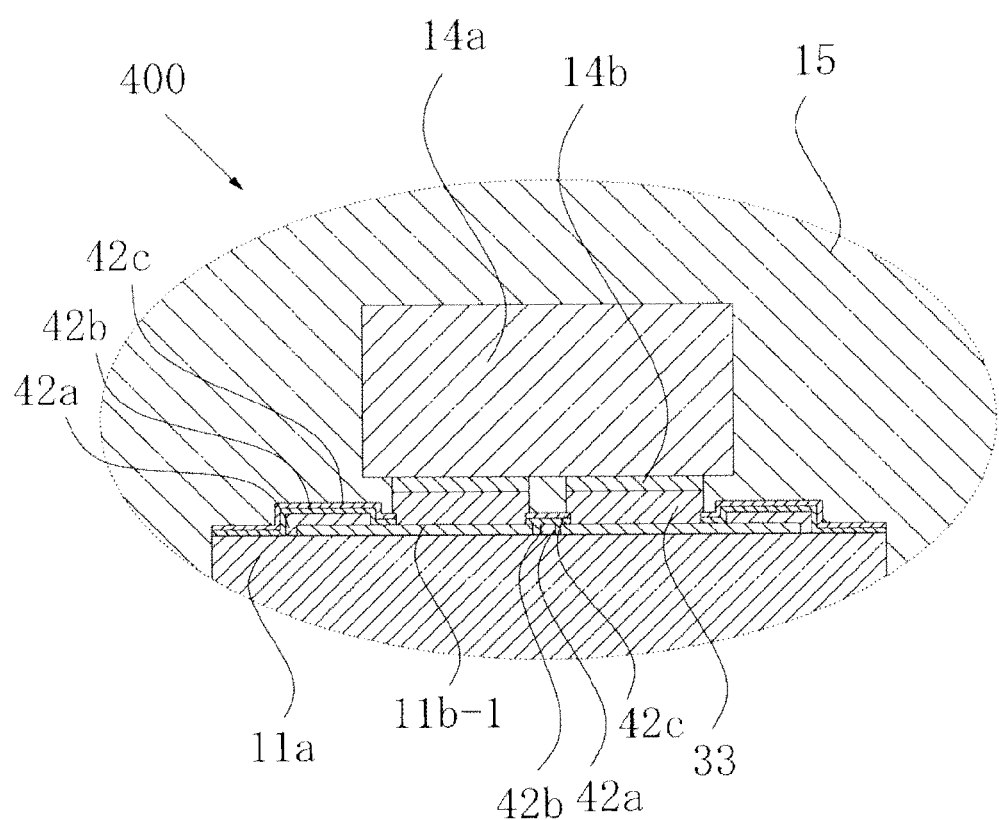
FIG. 4 is a schematic plan view partially showing an embodiment of a light emitting device according to the present invention.

Also, as shown in FIG. 4, the first layer 42a preferably cover the upper surface of the interconnect pattern 11b except for the mounting portion 11b-1 and the upper surface of the base member substrate 11a exposed through the interconnect pattern 11b, in a separate manner. Accordingly, even at the exposed portion of the base member 11a around the light emitting element 14, the high-density incident light can be efficiently reflected and effectively extracted to outside.

Second Layer

The second layer 12b covers the upper surface and the side surfaces of the first layer 12a continuously. Further, a part of the upper surface of the second layer 12b faces the lower surface of the semiconductor stacked layer structure of the light emitting element chip 14. As described above, in the case where the light emitting element chip 14 has the electrodes 14b on its lower surface side, the second layer according to the present invention shows a function of an insulating film which prevents occurrence of short circuit with the interconnect pattern 11b, and at the same time, shows a function of a protective film which suppress corrosion or breakage of the interconnect pattern 11b, and a function of a reflecting film which appropriately reflects light from the light emitting element chip 14.

As described above, in order to serve as an insulating film, the second layer 12b preferably continuously covers the upper surface and the side surfaces of the first layer 12a, but as a reflecting film, it is sufficient to cover at least the upper surface of the first layer 12.

The second layer 12b is made of a dielectric multilayer reflecting film made with stacked layers of dielectric films of different refractive indices. The dielectric multilayer reflecting film is made by stacking at least two dielectric films respectively made of an oxide or nitride of element selected from the group consisting of Si, Ti, Zr, Nb, Ta, and Al, and having different refractive indices. It is specifically a multi-layer structure, in which dielectric layers each having a thickness corresponding to about ¼ of the average wavelength in the layer are alternately stacked in order to obtain suitable reflection in the range of light wavelength irradiated from the light emitting element chip 14. With this, using the interference due to reflected light at the interface between the constituting layers of the second layer, light from the light emitting element chip 14 incident to the second layer 12b, components of the light of small incident angles can be reflected more efficiently than in the case where only the first layer 12a is used. The thickness of the second layer 12b is not specifically limited as long as sufficient reflectivity can be obtained without reducing the productivity. For example, in the case where the second layer 12b has a first dielectric film made of $SiO_2$ and a second dielectric film made of $Nb_2O_5$ alternately stacked, it is preferable that the first dielectric film of 70 nm or more and 95 nm or less and a second dielectric film of 40 nm or more and 60 nm or less are stacked at a period of 1 or more and 20 or less.

The second layer 12b is located directly under or approximately under the light emitting element chip 14, so that light from the light emitting element chip 14 enters the second layer 12b from front direction at small incident angles. For this reason, it is preferable to design the second layer 12b to be able to reflect light of small incident angles. Specifically, the reflectance of the second layer 12b can be set to higher value than the reflectance of the first layer 12a with respect to light with the incident angle of 0 to 10 degrees, preferably the incident angle of 0 to 20 degrees, and more preferably the incident angle of 0 to 30 degrees. With this, the reflectance as the entire light emitting layer 12 can be improved. That is, the second layer 12b has light transmissivity, so that even light of incident angles which the second layer 12b is not able to reflect, can be reflected at the first layer provided beneath the second layer 12b. Thus, providing the first layer 12a and the second layer 12b in this order from the base member 11a, greater light reflection becomes possible.

Particularly, such a structure is advantageous because when the surface of the light emitting element chip 14 facing the second layer 12 has light transmissive property, a large amount of light from the light emitting element chip enter the second layer 12b from the front direction at small incident angles.

Figure 3:
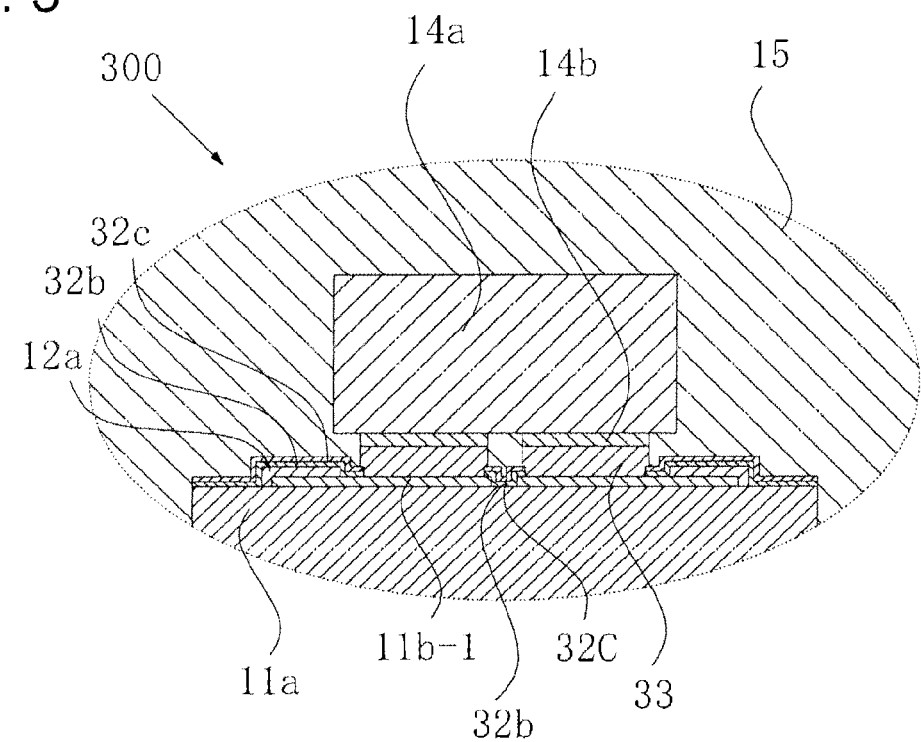
FIG. 3 is a schematic plan view partially showing an embodiment of a light emitting device according to the present invention.

As shown in FIG. 3 and FIG. 4, the second layer 32b, 42b preferably continuously covers the first layer 12a, 42a and the base member 11a exposed through the interconnect pattern 11b. With this arrangement, the light from the light emitting element chip 14 irradiated at close range with high density can be efficiently reflected and effectively extracted to outside. Specifically, in the light emitting device in which the light emitting element 14 is mounted on the interconnect pattern 11b in a flip-chip manner, the semiconductor stacked layer structure 14a of the light emitting element chip 14 is oppositely placed over the base member 11a exposed through the interconnect pattern 11b. Therefore, light is irradiated toward the base member 11a which is exposed through the interconnect pattern with high light density. Thus, significant effect of improvement in the optical output owing to the structure described above can be obtained.

Light Emitting Element Chip

In the light emitting element chip 14 of the present embodiment, the electrodes 14b are fixed so as to face toward the mounting portion 11b-1 of the interconnect pattern 11b. The light emitting element chip 14 has a semiconductor light emitting element structure which includes at least a light emitting layer, more suitably a semiconductor stacked-layer structure 14a, formed by disposing a first conductive-type semiconductor, a light emitting layer, and a second conductive-type semiconductor in this order on a substrate, and to the semiconductor stacked layer structure, electrodes 14b for supplying electric current are provided. Specific examples of the semiconductor stacked-layer structure 14a includes a structure in which, an n-type semiconductor layer, a light emitting layer, and a p-type semiconductor layer are stacked in this order from the substrate side. For example, using a GaN-based compound semiconductor which is an nitride semiconductor, an n-type semiconductor layer of about 1 to 2 µm thickness, a light emitting layer of about 50 to 150 nm thickness, and a p-type semiconductor layer of about 100 to 300 nm thickness are disposed on a sapphire substrate with interposing an under layer such as a buffer layer, a mask layer, or an intermediate layer therebetween. The structure of the light emitting element 14 is not limited thereto, and other semiconductor material may be employed, and a protective layer, a light reflecting layer, or the like may also be provided.

The light emitting element chip 14 has both the electrodes on one surface side of the semiconductor staked-layer structure 14a, but it is not limited thereto, each electrode may be provided on the corresponding upper and the lower surface of the semiconductor stacked-layer structure. Also, in the present embodiment, the light emitting element chip 14 is fixed in a flip-chip configuration with the electrodes 14b and the mounting portion 11b-1 of the interconnect pattern facing each other. Further, the light emitting element chip 14 may be arranged in a matrix form of, for example 2×2 units, where a plurality of semiconductor light emitting element structures are spaced apart from each other.

Third Layer

Figure 2:
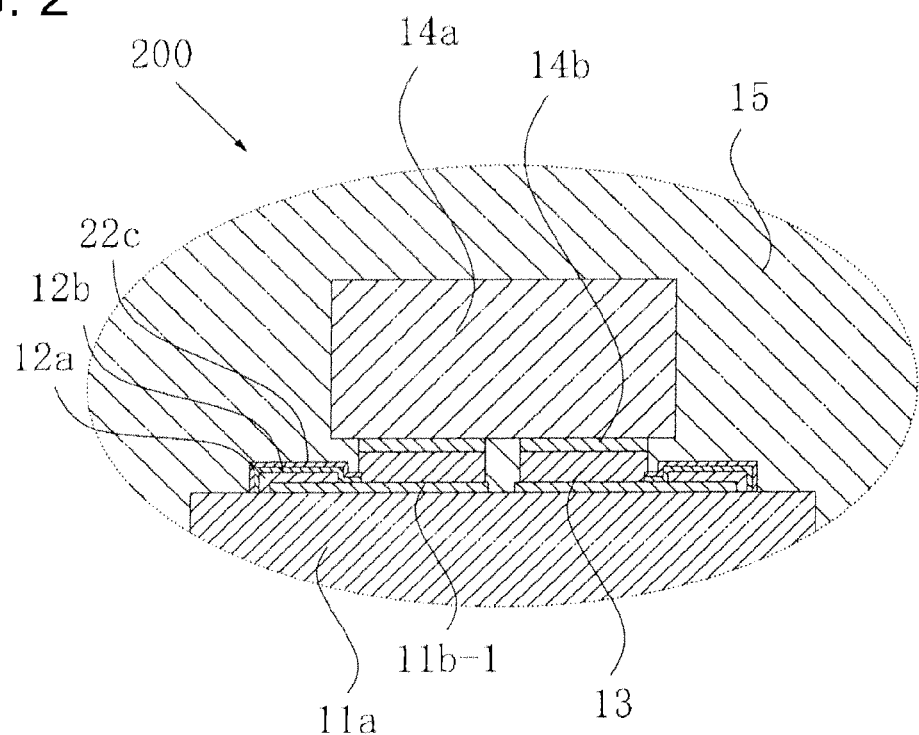
FIG. 2 is a schematic plan view partially showing an embodiment of a light emitting device according to the present invention.

As shown in FIG. 2, the light emitting device 200 of the present embodiment preferably has, between the above-described second layer 12b and the light transmissive sealing member 15 to be described later, a third layer 22c which is made of a material having a refractive index lower than that of the light transmissive sealing member 15, and which is capable of totally reflecting the light emitted from the light emitting element chip 14 and penetrated through the light transmissive sealing member 15. The third layer 22c is arranged at a location lower than the light emitting element chip 14, and of the light emitted from the light emitting element chip 14 into the third layer 22c, the third layer 22c is capable of totally reflecting a part of the component of light with incident angles which are unable to be sufficiently reflected by the first layer 12a or the second layer 12b (light with large incident angles, that is, the light entered in a lateral direction).

The material of the third layer 22c is not specifically limited as long as it is made of a transparent insulating material with a refractive index lower than that of the light transmissive sealing member 15, and capable of totally reflecting a part of light emitted from the light emitting element chip 14 and transmitted through the light transmissive sealing member 15, but the third layer 22c is preferably formed with an inorganic material which enables the formation with a relatively small thickness. The thickness of the third layer is preferably 300 nm or more and 2000 nm or less, which allows formation of the layer without reducing the productivity and prevents penetration of evanescent wave at the time of totally reflecting light from the light emitting element chip 14, and sufficient total reflection can be obtained. Particularly, a thin dielectric film having a low refractive index with a thickness of 300 nm or more is preferably employed. With this, unity with the second layer 12b, which is an underlayer, can be improved, and the layer can be disposed continually in the same manner as in the second layer 12b.

The third layer 22c is aimed to totally reflect the light from a lateral direction at large incident angle. Therefore, the reflectance of the third layer 22c can be set higher value than the reflectance of the first layer 12a with respect to light with the incident angle of 80 to 90 degrees, preferably the incident angle of 70 to 90 degrees, and more preferably the incident angle of 60 to 90 degrees. With this, the reflectance as the entire light reflecting layer 12 can be improved. That is, the third layer 22c has light transmissivity, so that even light of incident angles which the third layer 22c is not able to reflect, can be reflected at the second layer provided beneath the third layer 22c. Further, even the light with incident angles to which the second layer 12b unable to reflect, can be reflected by the first layer 12a provided under it. Thus, providing the first layer 12a, the second layer 12b, and the third layer 22c in this order from the base member 11a, greater light reflection becomes possible.

As shown in FIG. 3 and FIG. 4, the third layer 32c, 42c preferably continuously covers the first layer 12a, 42a and the base member 11a exposed through the interconnect pattern 11b, as in the second layer 32b, 42b. With this arrangement, the light from the light emitting element chip irradiated at close range with high density can be efficiently reflected and effectively extracted to outside.

Bonding Member

The mounting substrate 11 according to the present embodiment is for mounting the light emitting element chip 14 thereon in a flip-chip manner. Therefore, of the upper surface of the interconnect pattern 11b, bonding pads 13, which are a bonding member for connecting with the respective electrodes 14b of the light emitting element chip 14, are provided to cover the upper surface of the mounting portion 11b-1 and a part of the upper surface of the second layer 12b.

Light Transmissive Sealing Member

The light transmissive sealing member 15 is not specifically limited as long as it is transmissive to the light from the light emitting element chip 14. In view of releasing the stress of the light emitting element chip 14 and the interconnect pattern with respect to the bonding member, light resistance of material, refractive index of light, or the like, the material can be selected from one or more of resins, such as a polyolefin-based resin, a polycarbonate resin, a polystyrene, an epoxy resin, an acrylic resin, an acrylate resin, a methacrylate resin (PMMA etc.), an urethane resin, a polyimide resin, a polynorbornene resin, a fluororesin, a silicone resin, a modified silicone resin, a modified epoxy resin, and a glass epoxy resin, and a liquid crystalline polymer, glass, and materials commonly used in the art. Also, the light transmissive member 15 may be provided with a fluorescent material, a coloring agent, or a light diffusion agent, according to the purpose.

The light transmissive sealing member 15 may be formed such that the upper surface side, which is the light extracting side, is formed in a lens shape, or may be applied as a coating to cover the light emitting element chip 14 and the surface of the mounting substrate 11, or formed with a plurality of layers. The light transmissive sealing member 15 of the present embodiment is also filled in the gaps between the light emitting element chip 14 and the mounting substrate 11, but it is not limited thereto.

The light emitting device according to the present invention may be provided with members other than those described above. For example, in order to protect the light emitting element from static electricity and overvoltage, a static electricity protective element such as a Zener diode may also be provided.

Example 1

The light emitting device 100 of the present embodiment can be manufactured in a method described below.

On the upper surface of a nitride aluminum base member 11a of 1 mm thickness, Ti (0.1 µm), Cu (0.5 µm), Ni (1.0 µm), Au (0.5 µm), and Cr (0.1 µm) are vapor-deposited to form an interconnecting layer, and in order to form a plurality of light emitting devices, a plurality of interconnecting patterns 11b having a predetermined shape are formed. Next, on the upper surface of each interconnect pattern 11b except for the mounting portion for mounting each LED chip 14, Ti (0.1 µm) and Al (1.0 µm) are deposited in this order by way of vapor-deposition to form the first layer 12a. Following that, the second layer 12b is formed such that, three cycles of $SiO_2$ (87.9 nm) and $Nb_2O_5$ (51.6 nm) are alternately deposited by way of vapor-deposition to form a stacked layer which covers the surface of the first layer 12a. Then, the bonding pads 13 are formed such that, Ti (0.1 µm), Pt (0.2 µm), and Au (0.5 µm) are stacked in this order to cover the upper surface of the mounting portion 11b-1 for mounting the light emitting element chip 14 and a part of the upper surface of the second layer 12b.

Next, on each bonding pad 13 on the mounting substrate 11, the corresponding electrodes 14b of InGaN-based blue light-emitting LED chip 14 with an emission wavelength of 450 nm are respectively temporarily fixed by a paste containing Au and Sn, and then eutectically bonded by using a reflow apparatus under a nitrogen atmosphere, with a maximum achieving temperature to 320° C.

Next, the molding substrate 11, with each LED chip 14 mounted, is placed in a mold of a compression molding machine having a shape capable of forming the light transmissive sealing member 15 with a hemispherical lens shape of 8 mm in diameter for each LED chip 14. Then, a liquid silicone resin is added in drops into the mold and then cured at 150° C. for 180 seconds. Thereafter, removed from the mold, and further cured at 150° C. for 4 hours. Thus, a plurality of light transmissive sealing members 15, each sealing respective LED chips, is formed on the mounting substrate 11. Finally, dicing is carried out on the mounting substrate having an array of LED chips 14 with a light transmissive sealing member 15 attached thereto, to obtain individual LED chips 14. In this manner, the light emitting device such as shown in FIG. 1 can be obtained.

The light emitting device 100 according to the present example is capable of reflecting, of the light emitted from the LED chip 14 penetrates through the light transmissive sealing member 15, 95% or more of the components of incident light to the surface of the second layer 12b with incident angles of 0 to 35 degrees and 80% or more of the components of light with incident angles other than the above.

Example 2

The light emitting device 200 is fabricated in the same manner as in Example 1, except that, the third layer 22c made of $SiO_2$ (500 nm) is disposed over the internal pattern 11a other than the mounting portion, so as to cover the surface of the second layer 12b. The light emitting device 200 according to the present example is capable of reflecting, of the light emitted from the LED chip 14 penetrating the light transmissive sealing member 15, 95% or more of the components of incident light to the surface of the third layer 22c with incident angles of 0 degree to 35 degrees, and capable of totally reflecting approximately entire components of light with 65 degrees to 90, and also capable of reflecting 80% or more of the components of light with incident angles other than the above.

Example 3

The light emitting device 300 is fabricated in the same manner as in Example 2, except that the second layer 32b and the third layer 32c are disposed to continuously cover the upper surface of the first layer 12a and the upper surface of the base member 11a exposed through the interconnect pattern 11a. The light emitting device 300 of the present example exhibits further improvement in optical output, about 3% higher than that of the light emitting device of Example 2.

Example 4

The light emitting device 400 is fabricated in the same manner as in Example 3, except that the first layer 42a is disposed on the upper surface 11a of the base member exposed through the interconnect pattern 11b, so as to be spaced apart from the interconnect pattern 11b. Further, the second layer 42b and the third layer 42c are disposed to continuously cover the upper surface of the first layer 42a and the upper surface of the base member 11a exposed through the interconnect pattern 11a. The light emitting device 300 of the present example exhibits further improvement in optical output, about 2% higher than that of the light emitting device of Example 3.

Example 5 to Example 8 (No Drawings)

The light emitting devices are fabricated in the same manner as in Examples 1 to 4 respectively, except that prior to forming the light transmissive sealing member 15 with a lens shape by using the compression molding machine, a small amount of a thermosetting silicone resin is applied on the side surfaces and upper surfaces of each of the LED chips 14 arrayed on the mounting substrate 11, and attach a ceramics plate which contains a fluorescent material and cut into a predetermined shape respectively thereon, then cure the resin at 150° C. for 600 sec. The light emitting devices of Examples 5 to 8 exhibit the same level of effects with that of Examples 1 to 4, respectively.

INDUSTRIAL APPLICABILITY

The light emitting device according to the present invention is capable of reducing optical loss and emission with high optical output. These light emitting devices can be utilized in applications such as various indicators, lighting apparatus, displays, backlight light sources for liquid crystal displays, and further, facsimiles, copiers, image reading systems in scanners or the like, and projector devices.

DENOTATION OF REFERENCE NUMERALS

100, 200, 300, 400, . . . light emitting device
11 . . . mounting substrate
11a . . . base member
11b . . . interconnect pattern
11b-1 . . . mounting portion
11b-2 . . . external connection electrode terminal
12 . . . light reflecting layer
12a, 42a . . . first layer
12b, 32b, 42b . . . second layer
22c, 32c, 42c . . . third layer

13, 33 . . . bonding pad
14 . . . light emitting element chip
14a . . . semiconductor stacked layer structure
14b . . . electrode
15 . . . light transmissive sealing member

What is claimed is:

1. A light emitting device comprising:
   a base member;
   an interconnect pattern disposed on an upper surface of the base member; and
   a light reflecting layer comprising (i) a first layer made of a metal material and disposed on a part of an upper surface of the interconnect pattern, and (ii) a second layer comprising a dielectric multilayer reflecting film that includes stacked layers of dielectric films of different refractive indices and covering an upper surface and side surfaces of the first layer;
   a light emitting element chip fixed to face at least a part of the light reflecting layer; and
   a light transmissive sealing member sealing the light reflecting layer and the light emitting element chip,
   wherein the base member includes an extending portion that extends outwardly through the light transmissive sealing member in a plan view of the light emitting device
   wherein the extending portion of the base member is covered with the light reflecting layer, and
   wherein the interconnect pattern is covered with the light reflecting layer from an upper surface at a periphery region of the interconnect pattern to an outer side surface of the interconnect pattern contiguously.

2. The light emitting device according to claim 1, wherein the second layer covers an upper surface of the base member exposed through the interconnect pattern.

3. The light emitting device according to claim 2, wherein the first layer is disposed between the upper surface of the base member exposed through the interconnect pattern and the second layer, and spaced apart from the interconnect pattern.

4. The light emitting device according to claim 1, wherein the light reflecting layer includes a third layer covering an upper surface and side surfaces of the second layer, and wherein the third layer is made of a material having a refractive index smaller than a refractive index of the light transmissive member, and wherein the third layer has a thickness capable of totally reflecting light emitted from the light emitting element chip.

5. The light emitting device according to claim 4, wherein the third layer is a thin dielectric film having a low refractive index with a thickness of 300 nm or more.

6. A light emitting device comprising:
   a base member;
   an interconnect pattern disposed on an upper surface of the base member;
   a light reflecting layer having
      a first layer made from a metal material and disposed on an upper surface of the base member,
      a second layer comprising a dielectric multilayer reflecting film that includes stacked layers of dielectric films of different refractive indices and covering an upper surface of the first layer, and
      a third layer covering an upper surface of the second layer;
   a light emitting element chip fixed so as to face at least a part of the light reflecting layer; and
   a light transmissive sealing member sealing the light reflecting layer and the light emitting element chip, wherein the third layer is made of a material having a refractive index smaller than a refractive index of the light transmissive sealing member, wherein the base member comprises a mounting portion where the light emitting element chip is mounted, and the light emitting element chip comprises electrodes on a surface which faces the mounting portion, wherein the base member extends outwardly through the light transmissive sealing member in a plan view of the light emitting device, and wherein portions of the interconnect pattern on the extending portion of the base member are covered with the light reflecting layer from an upper surface at a periphery region of the interconnect pattern to an outer side surface of the interconnect pattern contiguously.

7. The light emitting device according to claim 6, wherein the third layer has a thickness such that the third layer is capable of totally reflecting light emitted from the light emitting element chip.

8. The light emitting device according to claim 1, wherein the first layer is made of at least one selected from the group consisting of Ag, Al, and Rh.

9. The light emitting device according to claim 1, wherein a thickness of the first layer is from 50 nm to 2000 nm.

10. The light emitting device according to claim 1, wherein the dielectric multilayer reflecting film of the second layer is made by stacking at least two dielectric films respectively made of an oxide or nitride of element selected from the group consisting of Si, Ti, Zr, Nb, Ta, and Al.

11. The light emitting device according to claim 1, wherein, where the second layer has a first dielectric film and a second dielectric film alternately stacked, the second layer is so configured that the first dielectric film is from 70 nm to 95 nm in thickness and the second dielectric film is from 40 nm to 60 nm in thickness, with the first dielectric film and the second dielectric film being stacked together from 1 to 20 alternations.

12. The light emitting device according to claim 4, wherein the third layer is made of $SiO_2$.

13. The light emitting device according to claim 4, wherein a thickness of the third layer is from 300 nm to 2000 nm.

14. The light emitting device according to claim 6, wherein the first layer is made of at least one selected from the group consisting of Ag, Al, and Rh.

15. The light emitting device according to claim 6, wherein a thickness of the first layer is from 50 nm to 2000 nm.

16. The light emitting device according to claim 6, wherein the dielectric multilayer reflecting film of the second layer is made by stacking at least two dielectric films respectively made of an oxide or nitride of element selected from the group consisting of Si, Ti, Zr, Nb, Ta, and Al.

17. The light emitting device according to claim 6, wherein where the second layer has a first dielectric film and a second dielectric film alternately stacked, the second layer is so configured that the first dielectric film is from 70 nm to 95 nm and the second dielectric film is from 40 nm to 60 nm, with the first dielectric film and the second dielectric film being stacked from 1 to 20 alternations.

18. The light emitting device according to claim 6, wherein the third layer is made of $SiO_2$.

19. The light emitting device according to claim 6, wherein a thickness of the third layer is from 300 nm to 2000 nm.

20. The light emitting device according to claim 1, wherein the base member further comprises an external connection electrode terminal on the extending portion of the base member, and wherein the light reflecting layer is arranged to cover the interconnect pattern on the extending portion of the base member in areas other than the external connection electrode terminal.

21. The light emitting device according to claim 1, wherein the base member is made of ceramic.

* * * * *